United States Patent
Cho

(10) Patent No.: US 7,236,505 B2
(45) Date of Patent: Jun. 26, 2007

(54) FABRY-PEROT LASER GENERATING MODE-LOCKED CHANNEL AND METHOD FOR FABRICATING THE SAME

(75) Inventor: Shi-Yun Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 303 days.

(21) Appl. No.: 10/794,980

(22) Filed: Mar. 5, 2004

(65) Prior Publication Data

US 2005/0041698 A1    Feb. 24, 2005

(30) Foreign Application Priority Data

Aug. 20, 2003    (KR) ............... 10-2003-0057700

(51) Int. Cl.
*H01S 3/098* (2006.01)
(52) U.S. Cl. ................................... 372/18
(58) Field of Classification Search ............. 372/18
See application file for complete search history.

(56) References Cited

U.S. PATENT DOCUMENTS

| | | | | |
|---|---|---|---|---|
| 5,349,596 A | * | 9/1994 | Molva et al. | 372/43.01 |
| 6,167,070 A | * | 12/2000 | Sakata | 372/45.01 |
| 6,222,871 B1 | * | 4/2001 | Chang-Hasnain et al. | 372/96 |
| 6,470,039 B1 | * | 10/2002 | Ukita | 372/46.01 |
| 6,526,087 B1 | * | 2/2003 | Okuda | 372/96 |

\* cited by examiner

*Primary Examiner*—Minsun Oh Harvey
*Assistant Examiner*—Tod T. Van Roy
(74) *Attorney, Agent, or Firm*—Cha & Reiter, L.L.C.

(57) ABSTRACT

A Fabry-Perot laser generates a mode-locked channel having the same wavelength as that of light injected into the laser. The laser includes a semiconductor substrate and a lower cladding layer formed on the substrate. An active layer is formed on the lower cladding layer and has a band gap distribution that continuously varies in a longitudinal direction of the substrate. The laser further includes an upper cladding layer formed on the active layer and the lower cladding layer.

12 Claims, 7 Drawing Sheets

FABRY-PEROT LASER GENERATING MODE-LOCKED CHANNEL AND METHOD FOR FABRICATING THE SAME

CLAIM OF PRIORITY

This application claims priority to an application entitled "FABRY-PEROT LASER GENERATING MODE-LOCKED CHANNEL AND METHOD FOR FABRICATING THE SAME," filed in the Korean Intellectual Property Office on Aug. 20, 2003 and assigned Ser. No. 2003-57700, the contents of which are hereby incorporated herein by reference.

BACKGROUND OF THE INVENTION

1. Field of the Invention

The present invention relates to a coherent light source, and more particularly to a coherent light source being usable in a wavelength division multiplexing system.

2. Description of the Related Art

In a passive wavelength-division multiplexing system, a signal is transmitted to a large number of subscribers by means of a single optical fiber. The commonest type of the passive wavelength-division multiplexing system is a double star structure, in which a local base station, connected to a central base station by a single optical fiber, is located adjacent to a plurality of the subscribers, and is connected to each of the subscribers.

U.S. Pat. Ser. No. 6,411,410, filed in 2002 by Ian Robert Wright, et al., and entitled "WAVELENGTH-DIVISION MULTIPLEXING IN PASSIVE OPTICAL NETWORK", discloses the above-described passive wavelength-division multiplexing system. Downstream channels to subscribers are multiplexed to an optical signal which is transmitted to the local base station. The local base station demultiplexes the received signal among downstream channels having different wavelengths, and transmits the downward channels to each of the subscribers.

A semiconductor optical amplifier such as a Fabry-Perot laser is a semiconductor optical element that amplifies inputted light, and is used as a light source for generating the above-described downstream channels. The above passive wavelength-division multiplexing system injects light having a predetermined wavelength into the laser, thereby generating a mode-locked downstream channel having the same wavelength a s that of injected light.

FIG. 1 is a cross-sectional view of a conventional Fabry-Perot laser. With reference to FIG. 1, the above conventional Fabry-Perot laser has a MESA structure comprising a semiconductor substrate 110, a lower cladding layer 120 grown on the semiconductor substrate 110, an active layer 130 formed on the lower cladding layer such that a band gap in the active layer is uniformly distributed, an upper cladding layer 140 grown on the active layer, and a contact layer 150 stacked on the upper cladding layer.

Since the active layer 130 of the Fabry-Perot laser has a uniform band gap distribution, the Fabry-Perot laser generates a downstream channel in which a mode of a single wavelength is locked.

However, the band gap of the active layer is varied not only intentionally by a driving current, but easily varied unintentionally due to variation with external temperature. This latter effect on the band gap may cause a gain wavelength of the Fabry-Perot laser to stray from the wavelength of light inputted into the Fabry-Perot laser. The resulting mismatch reduces the gain of the downstream channel generated by the Fabry-Perot laser.

SUMMARY OF THE INVENTION

The present invention has been made in view of the above problems, and it is an object of the present invention to provide a Fabry-Perot laser, which is easily manufactured, and, as applied as a light source of a passive wavelength-division multiplexing system, compensates for the reduction in gain, due to variation in temperature, for a channel generated by mode-locking.

In accordance with one aspect of the present invention, the above and other objects can be accomplished by the provision of a Fabry-Perot laser generating a mode-locked channel having the same wavelength as that of light injected thereinto. The laser includes a semiconductor substrate, a lower cladding layer formed on the semiconductor substrate, and an active layer formed on the lower cladding layer. The latter has a band gap distribution continuously varied in a longitudinal direction of the semiconductor substrate. The laser also has an upper cladding layer formed on the active layer and the lower cladding layer, so that the upper and lower cladding layers sandwich the active layer.

In accordance with another aspect of the present invention, there is provided a method for fabricating a Fabry-Perot laser. The steps include (a) growing, on a semiconductor substrate, an active layer whose band gap distribution, continuously varies in a longitudinal direction of the substrate; and (b) selectively etching the active layer so that the active layer has a width in a direction transverse to the longitudinal direction, the width remaining uniform along the longitudinal direction.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

A preferred embodiment of the present invention is described in detail below with reference to the annexed drawings. Detailed description of known functions and configurations incorporated herein is omitted for clarity of presentation.

FIGS. 2 to 6 are schematic views respectively illustrating steps of a method for fabricating a Fabry-Perot laser generating a mode-locked channel, in accordance with an embodiment of the present invention. The method includes the steps of (a) growing a lower cladding layer 220, (b) growing an active layer 320 on the lower cladding layer, (c)

selectively etching the active layer 320, (d) growing an upper cladding layer 330, and (e) growing a contact layer 340.

Figure 1:
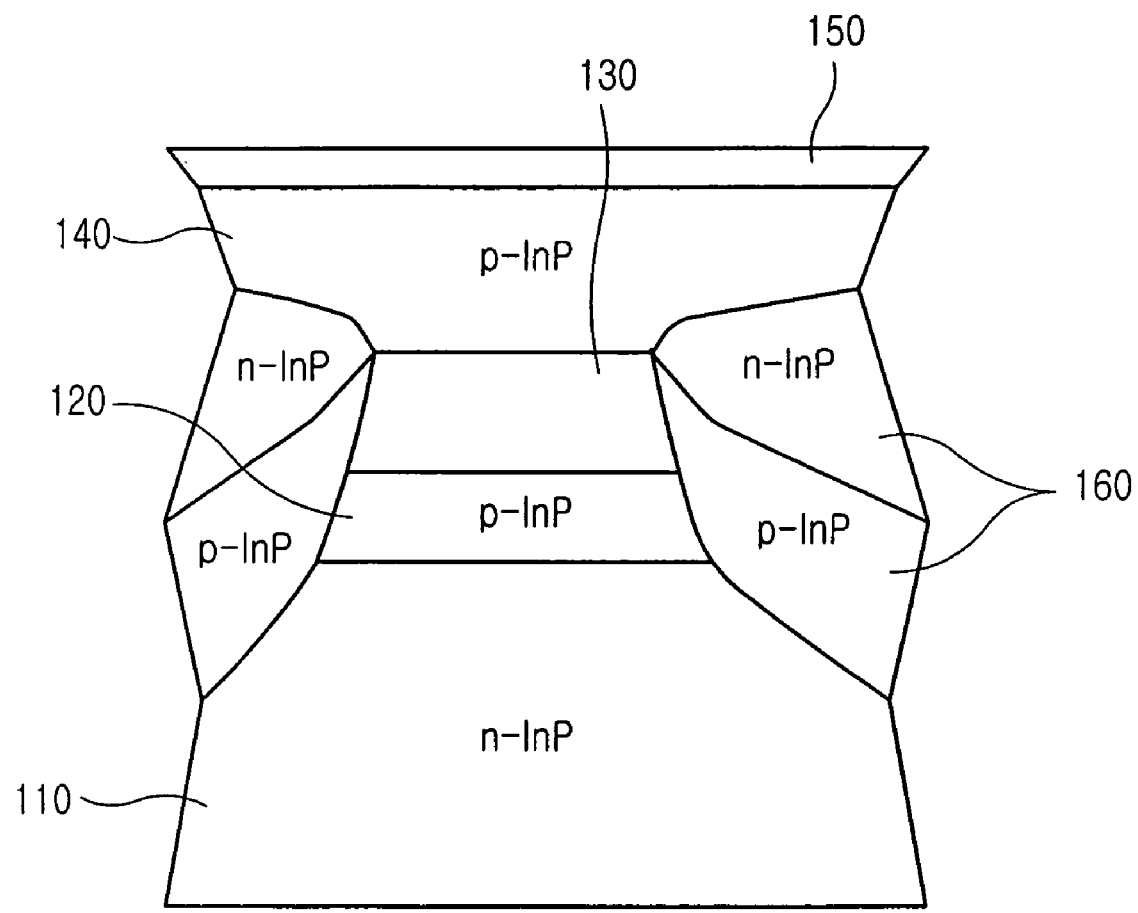
FIG. 1 is a cross-sectional view of a conventional Fabry-Perot laser.
Figure 2:
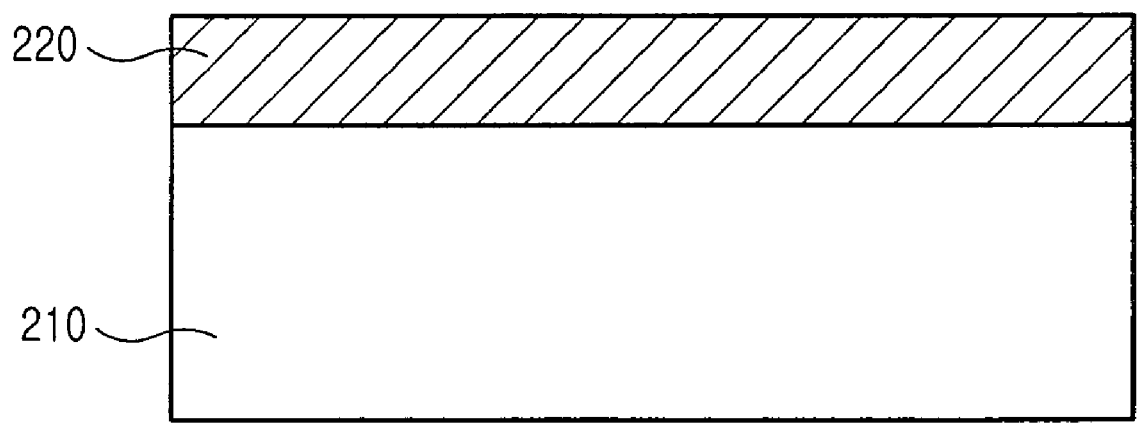
FIGS. 2 to 6 are schematic views illustrating a method for fabricating a Fabry-Perot laser, in which band gap distribution in an active layer is continuously changed along a longitudinal direction of a semiconductor substrate, in accordance with an embodiment of the present invention.

With reference to FIG. 2, in step (a), the lower cladding layer 220 is grown on a semiconductor substrate 210. The semiconductor substrate 210 is made of n-InP, and the lower cladding layer 220 is made of p-InP.

Figure 3:
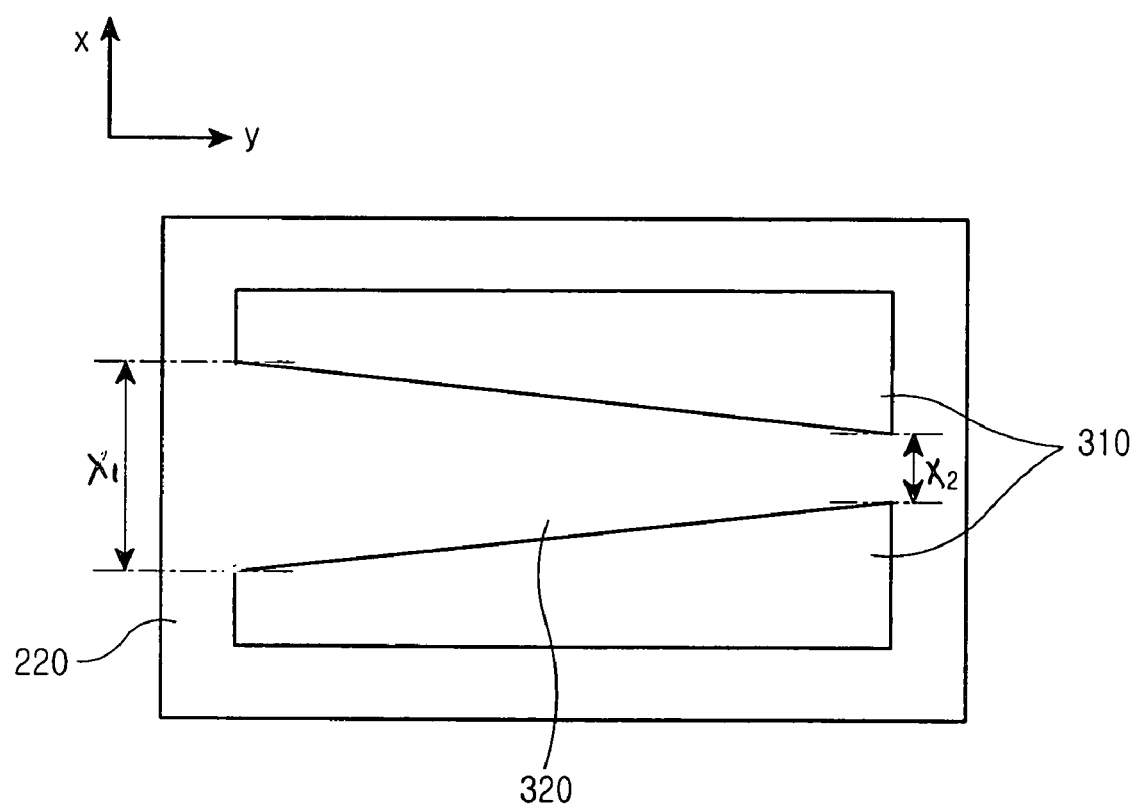

With reference to FIG. 3, in step (b), the active layer 320 is formed on the lower cladding layer 220. Step (b) includes the sub-steps of (b-1) forming a pair of masks 310 such that an interval ($x_1$–$x_2$) between the masks is continuously varied in a longitudinal direction (y-axis) of the semiconductor substrate 210, and (b-2) growing the active layer 320 in a gap of the interval between the masks.

In step (b-1), the masks 310 are formed by depositing a dielectric layer made of $SiO_2$ or $Si_3N_4$ on the lower cladding layer 220 by a plasma enhanced chemical vapor deposition (PECVD) or sputtering method, and by etching the deposited dielectric layer by a conventional lithography method. The masks 310 are formed such that the interval between the masks 310 is continuously varied in the longitudinal direction (y-axis) of the semiconductor substrate 210.

Figure 4:
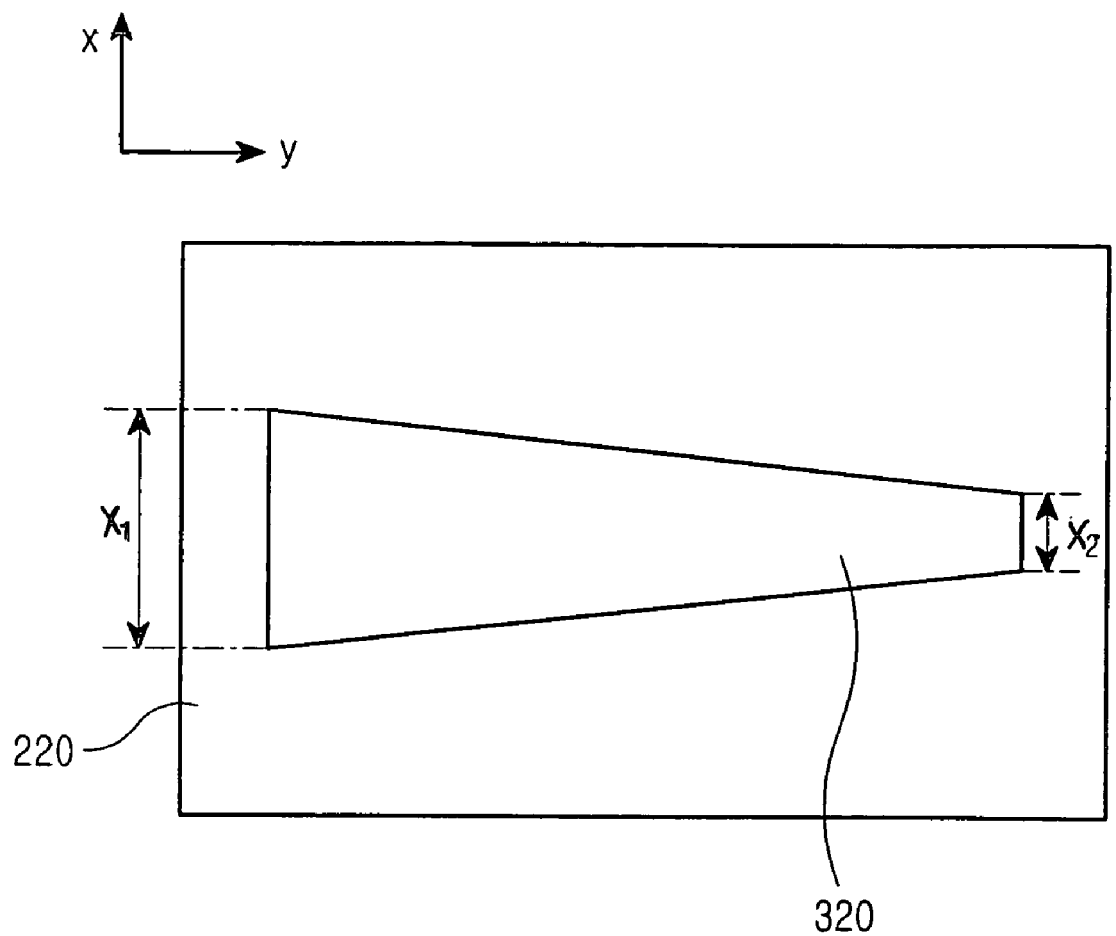

With reference to FIG. 4, in step (b-2), the active layer 320 is grown in the gap of the interval between the masks 310. The active layer 320 has band gap distribution, which continuously varies according to the variation in the separation interval between the masks 310. The masks 310 are removed after the active layer 310 is grown.

Figure 5:
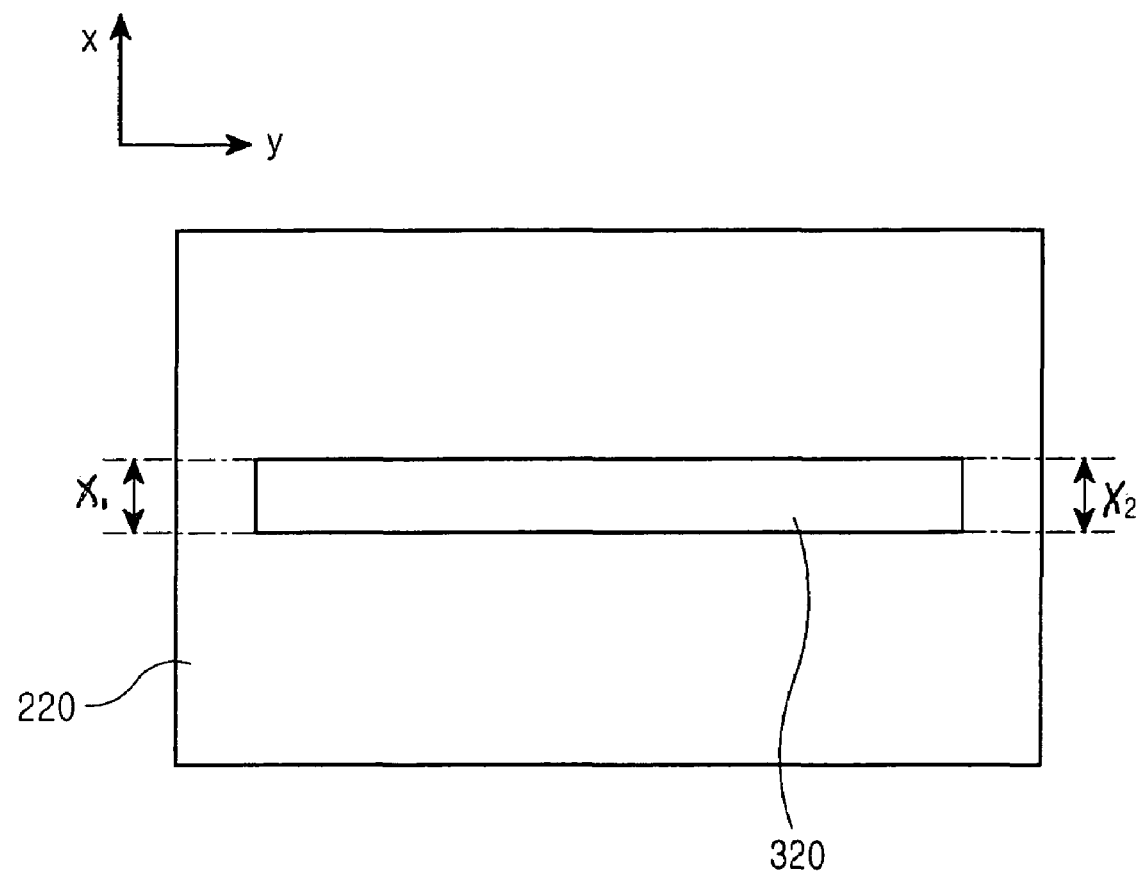

With reference to FIG. 5, in step (c), the active layer 320 is selectively etched such that the active layer 320 has a uniform width in the longitudinal direction of the semiconductor substrate 210. The band gap distribution is nevertheless continuously varied in the longitudinal direction of the semiconductor substrate 210.

Figure 6:
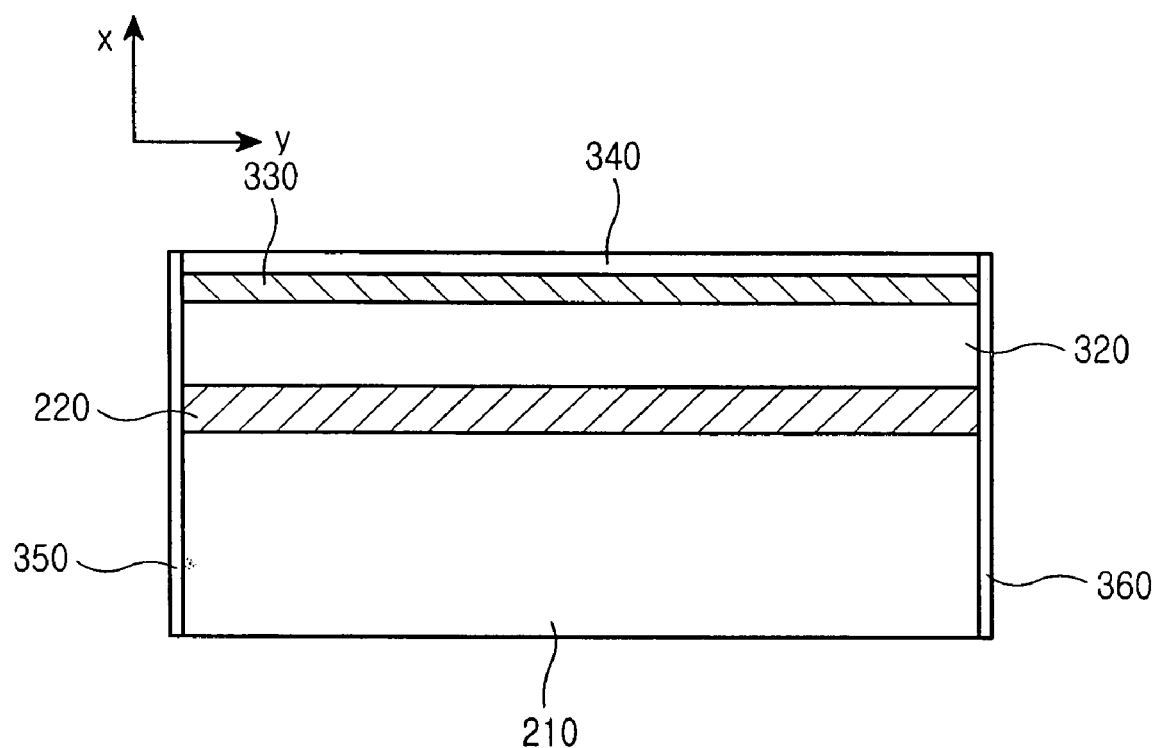

With reference to FIG. 6, in step (d), the upper cladding layer 330 is grown on the active layer 320 grown on the lower cladding layer 220. In step (e), the contact layer 340, made of $p^+$-InGaAs, is stacked on the upper cladding layer 330. After step (e), an antireflection layer 360 and a high reflection layer 350 are formed at both ends of the obtained structure. Thereby, a Fabry-Perot laser for outputting a mode-locked channel is fabricated.

The above-described Fabry-Perot laser can be etched in a buried strip shape by a wet etching or reactive ion etching (RIE) method. A current-limited area (not shown) is formed on the etched portion. The current-limited area is made of n-InP, p-InP or semi-insulating InP.

With reference to FIG. 6, the Fabry-Perot laser of the present invention, for generating a mode-locked channel having the wavelength of the injected light, comprises the semiconductor substrate 210, the lower cladding layer 220 formed on the semiconductor substrate, the active layer 320 formed on the lower cladding layer so that the band gap distribution in the active layer is continuously varied in the longitudinal direction, the upper cladding layer 330 formed on the active layer and the lower cladding layer, and the contact layer 340 formed on the upper cladding layer 330.

Notably, the active layer 320 has a band gap distribution that continuously varies from one end to the other end of the Fabry-Perot laser. For example, the band gap distribution can be continuously decreased from one end of the laser to the other end of the laser, or continuously increased from one end of the laser to the other end of the laser, the antireflection layer 360 being formed at one end of the laser, and the high reflection layer 350 being formed at the other end.

Figure 7:
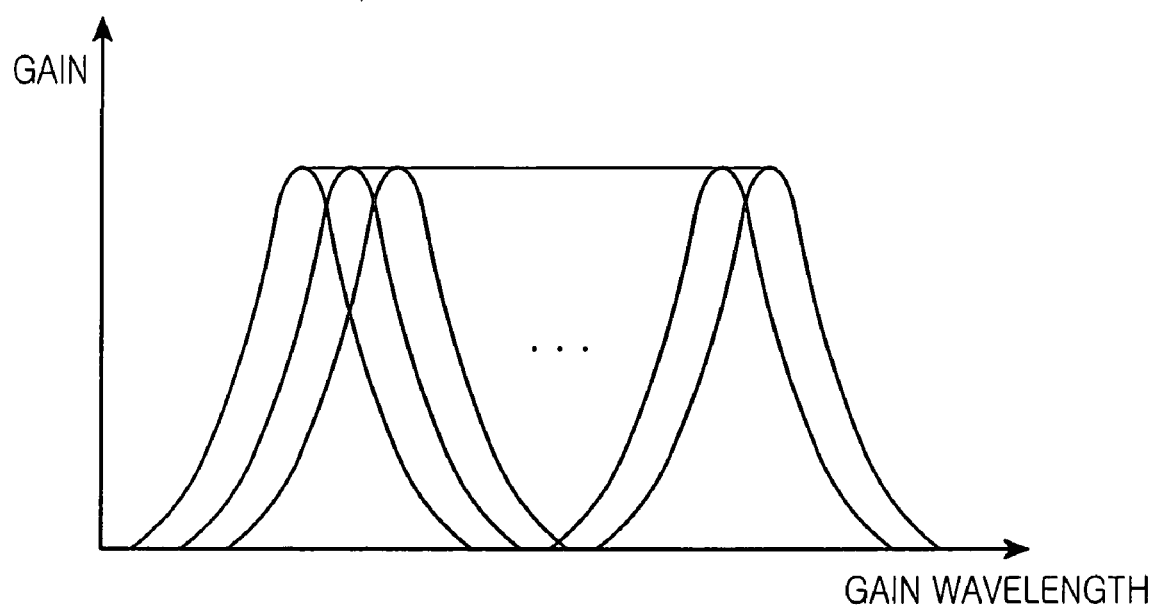
FIG. 7 is a graph showing distribution of a gain wavelength outputted from the active layer having the continuously changed band gap distribution.

As shown in FIG. 7, since the active layer has a continuously varying band gap distribution, it is possible to compensate for the variation in a predetermined gain wavelength ($\lambda_0$), generated by the variation in external temperature. That is, the continuously varying band gap distribution of the active layer compensates for the variation in the gain wavelength, caused by the variation in external temperature, thus avoiding loss of gain that would otherwise occur due to the variation in the temperature of the mode-locked channel generated by the Fabry-Perot laser.

As apparent from the above description and according to the principles of the present invention, a Fabry-Perot laser in which a band gap distribution in an active layer is continuously varied advantageously need not be provided with additional temperature compensating means. Production cost and form factor are therefore reduced. Further, since the band gap distribution in the active layer is continuously varied, it is possible to increase the number of mode-locked channels generated by the Fabry-Perot laser of the present invention.

Although only one embodiment of the present invention has been described in detail, those skilled in the art will appreciate that various modifications, additions, and substitutions to the specific elements are possible, without departing from the scope and spirit of the invention as disclosed in the accompanying claims.

What is claimed is:

1. A Fabry-Perot laser generating a mode-locked channel having the same wavelength as that of light injected into the laser, comprising:

a semiconductor substrate;

a lower cladding layer formed on the semiconductor substrate;

an active layer, formed on a portion of an upper surface of the lower cladding layer, the entire active layer having a continuously varying band gap distribution and an uniform thickness along a longitudinal direction of the semiconductor substrate; and an upper cladding layer formed on the active layer and the lower cladding layer.

2. The Fabry-Perot laser as set forth in claim 1, wherein the band gap distribution of the active layer is decreased from one end of the Fabry-Perot laser to an opposite end of the Fabry-Perot laser.

3. The Fabry-Perot laser as set forth in claim 2, said active layer having a width in a direction transverse to said longitudinal direction, said width remaining uniform along said longitudinal direction.

4. The Fabry-Perot laser as set forth in claim 3, further comprising a contact layer, made of $p^+$-InGaAs, formed on the upper cladding layer.

5. The Fabry-Perot laser as set forth in claim 4, further comprising an antireflection layer and a high reflection layer formed respectively against said one end and said opposite end.

6. The Fabry-Perot laser as set forth in claim 3, further comprising an antireflection layer and a high reflection layer formed respectively against said one end and said opposite end.

7. The Fabry-Perot laser as set forth in claim 2, further comprising a contact layer, made of $p^+$-InGaAs, formed on the upper cladding layer.

8. The Fabry-Perot laser as set forth in claim 1, said active layer having a width in a direction transverse to said longitudinal direction, said width remaining uniform along said longitudinal direction.

9. The Fabry-Perot laser as set forth in claim 1, further comprising a contact layer, made of $p^+$-InGaAs, adjoining the upper cladding layer.

10. The Fabry-Perot laser as set forth in claim 1, further comprising an antireflection layer and a high reflection layer formed respectively against one end of the laser and an opposite end of the laser.

11. The Fabry-Perot laser as set forth in claim 10, further comprising a contact layer, made of $p^+$-InGaAs, formed on the upper cladding layer.

12. The Fabry-Perot laser as set forth in claim 11, said active layer having a width in a direction transverse to said longitudinal direction, said width remaining uniform along said longitudinal direction.

* * * * *